(12) United States Patent
Edelhaeuser

(10) Patent No.: US 9,489,997 B2
(45) Date of Patent: Nov. 8, 2016

(54) HARDWARE ASSISTED META DATA LOOKUP

(71) Applicant: Crossbar, Inc., Santa Clara, CA (US)

(72) Inventor: Frank Edelhaeuser, Dresden (DE)

(73) Assignee: Crossbar, Inc., Santa Clara, CA (US)

(*) Notice: Subject to any disclaimer, the term of this patent is extended or adjusted under 35 U.S.C. 154(b) by 329 days.

(21) Appl. No.: 13/935,390

(22) Filed: Jul. 3, 2013

(65) Prior Publication Data

US 2015/0012694 A1    Jan. 8, 2015

(51) Int. Cl.
  G06F 12/00    (2006.01)
  G11C 11/00    (2006.01)
  G11C 13/00    (2006.01)
  G11C 15/04    (2006.01)
  G06F 12/10    (2016.01)

(52) U.S. Cl.
  CPC ......... *G11C 11/005* (2013.01); *G11C 13/0002* (2013.01); *G11C 15/04* (2013.01); *G11C 15/046* (2013.01); *G06F 12/109* (2013.01); *G11C 2213/71* (2013.01); *G11C 2213/77* (2013.01)

(58) Field of Classification Search
  None
  See application file for complete search history.

(56) References Cited

U.S. PATENT DOCUMENTS

| | | | |
|---|---|---|---|
| 7,949,851 B2* | 5/2011 | Allen et al. | 711/203 |
| 7,979,667 B2* | 7/2011 | Allen et al. | 711/203 |
| 2009/0150646 A1* | 6/2009 | Allen et al. | 711/213 |
| 2009/0172345 A1* | 7/2009 | Allen et al. | 711/208 |
| 2010/0287140 A1* | 11/2010 | Oza | 707/640 |
| 2013/0246721 A1* | 9/2013 | Fukutomi | G06F 3/0604 711/155 |
| 2014/0310483 A1* | 10/2014 | Bennett | G06F 12/00 711/154 |

* cited by examiner

*Primary Examiner* — Brian Peugh
(74) *Attorney, Agent, or Firm* — Amin, Turocy & Watson, LLP

(57) ABSTRACT

A memory system including a memory device. The memory device includes a substrate. A memory array defines a plurality of pages, each page including a data area for storing data and a spare area for storing metadata. A compare circuit is configured to receive metadata retrieved from a plurality of pages sequentially and compare the retrieved metadata to a search pattern. The physical location of the page can be determined by finding the search pattern. The memory array and the compare circuit are formed in different layers of the substrate.

20 Claims, 8 Drawing Sheets

US 9,489,997 B2

HARDWARE ASSISTED META DATA LOOKUP

BACKGROUND

The present invention relates to solid state devices and systems thereof

The assignee of the present patent application has focused its attention to resistive memory cells, believing its use as a resistive random-access memory (RRAM) could be an excellent candidate for ultra-high density non-volatile information storage. A typical resistive memory cell studied has an insulator layer provided between a pair of electrodes and exhibits electrical pulse induced hysteretic resistance switching effects.

The non-volatile characteristics and simple configuration enables the additional exploration of the resistive memory cell to be implemented in a wide range of different applications. In addition, the assignee is developing CMOS friendly fabrication processes such that the RRAM and can be manufactured on top of CMOS logic. From the above, a new semiconductor device structure and integration is desirable.

SUMMARY

The present invention relates to solid state devices. In an embodiment, a memory system includes a memory device. The memory device includes a substrate. A memory array defines a plurality of pages, each page including a data area for storing data and a spare area for storing metadata. A compare circuit is configured to receive metadata retrieved from a plurality of pages and compare the retrieved metadata to a search pattern. The memory array and the compare circuit are formed in different layers of the substrate.

The memory device further comprises a control layer; and a memory layer provided on top of the control layer. The compare circuit is formed in the control layer and the memory array is formed in the memory layer.

In an embodiment, a memory device includes a substrate; a memory array defining a plurality of pages, each page including a data area for storing data and a spare area for storing metadata; a plurality of two-terminal memory cells defining the memory array; and a compare circuit configured to receive metadata retrieved from a plurality of pages and compare the retrieved metadata to a search pattern. The memory array and the compare circuit are formed in different layers of the substrate.

The details of one or more embodiments are set forth in the accompanying drawings and the description below. Other features, objects, and advantages will be apparent from the description and drawings, and from the claims.

BRIEF DESCRIPTION OF THE DRAWINGS

Exemplary embodiments will hereinafter be described in conjunction with the appended drawings, wherein like designations denote like elements, and wherein.

DETAILED DESCRIPTION

The present invention relates to solid state devices. An embodiment relates to solid state resistive devices that perform hardware assisted meta data lookup operations.

Figure 1:
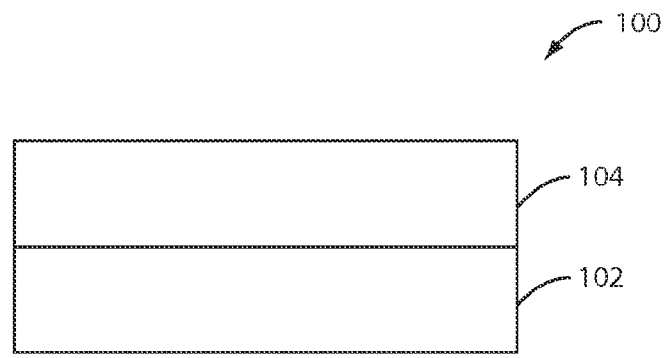
FIG. 1 illustrates a solid state device according to an embodiment of the present invention.

FIG. 1 illustrates a solid state device 100 according to an embodiment of the present invention. The device 100 includes a control structure 102 and a memory structure 104 provided on top of the control structure 102. Although the control structure 102 and the memory structure 104 are illustrated as a single layer, each structure may include multiple layers. The memory structure 104 includes memory cells that are configured to store data.

The memory cells can be non-volatile memory cells (e.g., resistive memory cells or Flash memory cells) or volatile memory cells according to implementation. The memory cells may also be two terminal cells or three terminal cells. In an embodiment, the memory cells in the memory structure 104 are two-terminal resistive memory cells. The control structure 104 includes metallization and circuitry for reading and writing the memory cells in the memory structure 104. Two structures 102 and 104 are typically interconnected using a plurality of vias.

Figure 2:
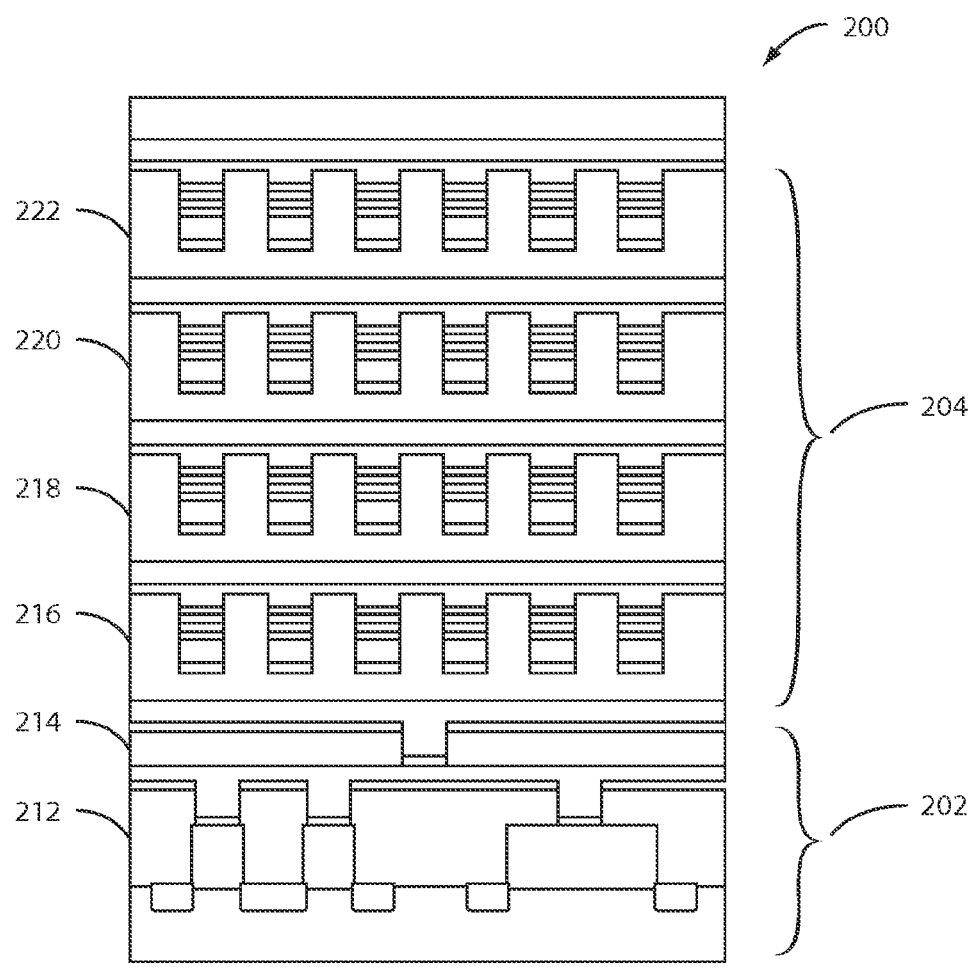
FIG. 2 illustrates a two-terminal nanoscale resistive random-access memory (RRAM) device according to an embodiment.

FIG. 2 illustrates a two-terminal nanoscale resistive random-access memory (RRAM) device 200 according to an embodiment of the present invention. RRAM is a two terminal device having a switching medium provided between top and bottom electrodes. The resistance of the switching medium can be controlled by applying electrical signal to the electrodes. The electrical signal may be current-based or voltage-based. As used herein, the term "RRAM" or "resistive memory device" refers to a memory device that uses a switching medium whose resistance can be controlled by applying electrical signal without ferroelectricity, magnetization and phase change of the switching medium. In various embodiments, memory device 200 is filamentary based.

As used herein, the term "nanoscale" or "nanostructure" refers to a structure having at least one dimension in the nanoscale range; for example, structures having a diameter or plural cross-sectional dimensions within the general range of 0.1 to 200 nanometers. This includes structures having all three spatial dimensions in the nanoscale; for example, a cylindrical nanocolumn or nanopillar having a length that is on the same order as its nanoscale diameter. In light of the present patent disclosure, it should be understood to one of ordinary skill in the art that various embodiments include nanoscale structures such as nanotubes, nanowires, nanorods, nanocolumns, nanopillars, nanoparticles, nanofibers, or the like.

The RRAM device 200 includes a control structure 202 and a memory structure 204. In an embodiment, the control structure 202 includes two layers 212 and 214 of metallization for routing read, write, and other operational signals to the memory structure 204, although other numbers of layers may also be used. In an embodiment, the memory structure 204 includes four layers 216, 218, 220, and 222 of memory cells, although other numbers of layers may also be used. In an embodiment, the memory cells are defined in a crossbar array structure, where each intersection of the crossbar array defines a memory cell.

Each memory cell has 4 $F^2$ configuration in an example implementation.

Figure 3:
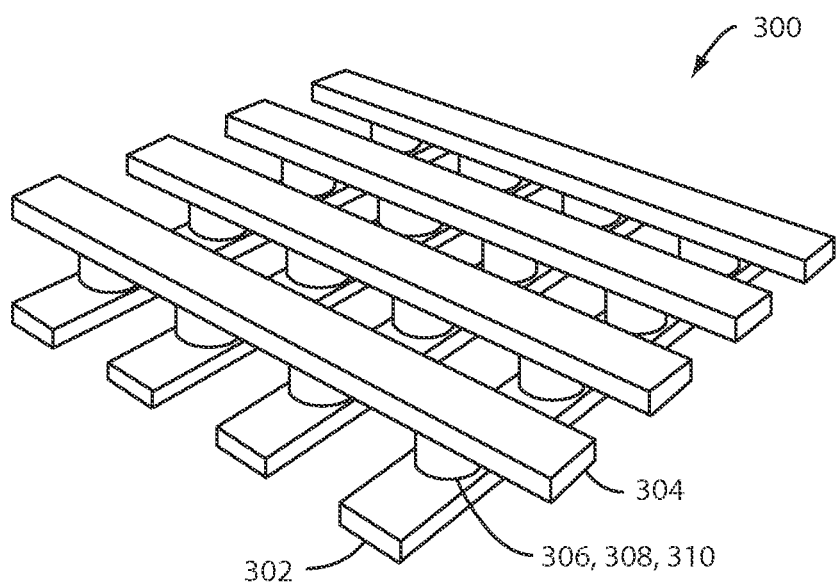
FIG. 3 illustrates a crossbar memory array according to an embodiment.

FIG. 3 illustrates a crossbar memory array 300 according to an embodiment. In particular, FIG. 3 illustrates a three-dimensional view of a single layer of a crossbar memory. The crossbar memory 300 includes a parallel array of bottom electrodes 302 extending along a first direction. In an embodiment, bottom electrodes 302 includes a bottom metal and a doped semiconductor layer formed on the bottom metal. The bottom electrodes are nanoscale in an embodiment. For example, the bottom electrodes have a width of about 40 nm and pitch of about 60 nm.

A parallel array of top electrodes 304 extends along a second direction to intersect the bottom electrodes. The top electrodes include metals capable of supplying filament-forming metal particles such as silver (Ag), titanium (Ti), gold (Au), nickel (Ni), aluminum (Al), chromium (Cr), iron (Fe), manganese (Mn), tungsten (W), vanadium (V) and cobalt (Co). In an embodiment, the top electrodes and the bottom electrodes are orthogonal to each other, although they may also be set at a non-orthogonal angle. The top electrodes are nanowires having a width of about 20~100 nm and a pitch of about twice the width of the nanowire, in some embodiments.

Typically, intersections 306 of the two arrays defines a two-terminal resistive memory cell 308. The memory cell at each intersection 306 includes top (304) and bottom metals separated by a switching layer 310. In the present embodiment, the switching layer includes an atomic-level switching medium. The switching structure can be the same width or narrower than the bottom electrode. In some embodiments, each memory cell in a crossbar memory array can store a single bit. In other embodiments, the memory cells exhibit multi-level resistance states, thereby allowing storage of a plurality of bits at each cell.

The crossbar memory array as described above may be fabricated on a silicon substrate with control circuits in an embodiment. In another embodiment, III-V type semiconductor compounds (such as Gallium Arsenide GaAs, Gallium Nitride GaN, Boron Nitride BN etc.) or II-VI type semiconductor compounds (such as Cadmium Selenide, Zinc Telluride etc.) may also be used as the substrate.

FIG. 3 illustrates examples of embodiments of the present invention. In other embodiments, other configurations of crossbar memory array 300 may also be used, such as that described in co-pending application Ser. Nos. 13/189,401, filed on Jul. 22, 2011, 13/149,757, filed on May 31, 2011, incorporated by reference herein, for all purposes.

Figure 4:
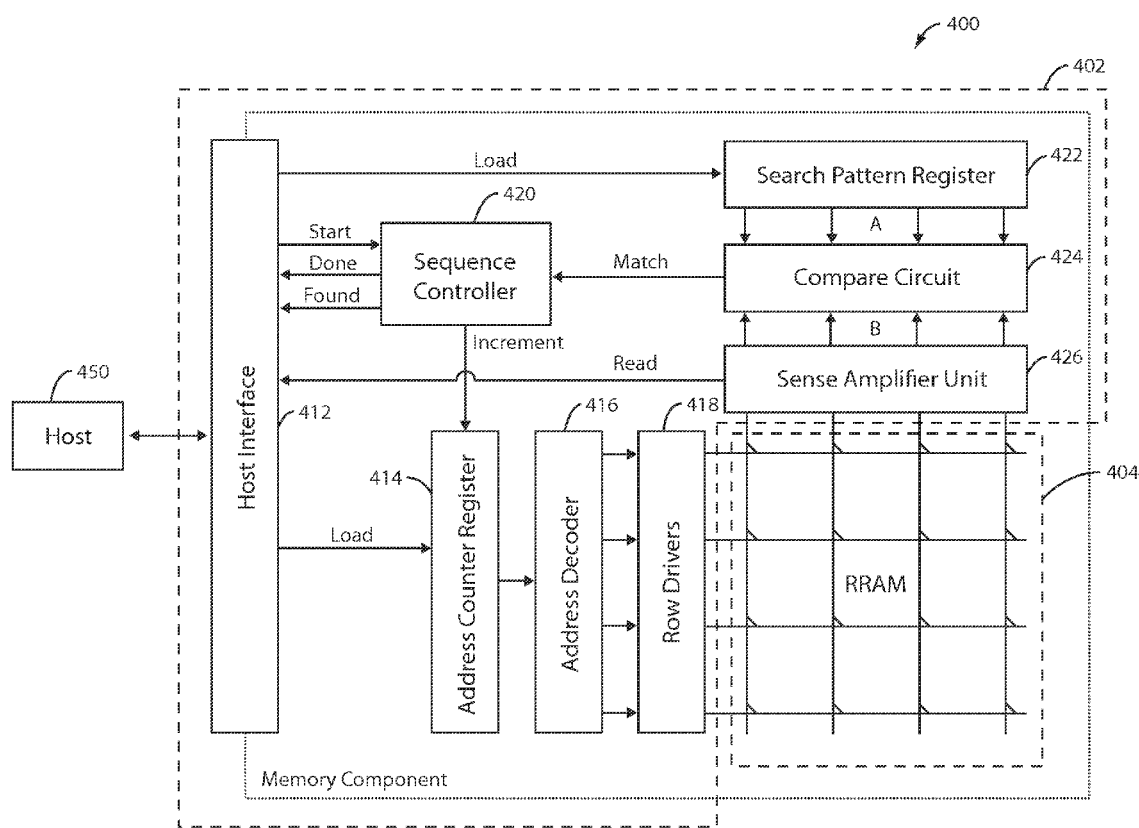
FIG. 4 illustrates a block diagram of a RRAM device according to an embodiment.

FIG. 4 illustrates a block diagram of a RRAM device 400 according to an embodiment. The RRAM device 400 includes a control structure 402 and a memory structure 404. Although these two are illustrated on the same plane, the control structure 402 and the memory structure 404 may be implemented on different fabrication planes. In an embodiment, the control structure 402 is provided below the memory structure 404, as shown in FIG. 2. The control structure 402 includes circuitry to control the operations performed on the memory cells in the memory structure 404. The memory cells in the memory structure 404 may be arranged in one or more memory arrays, as illustrated in FIG. 3. In an implementation, the memory structure 404 includes RRAM cells, but other types of cells may be used in other implementations.

The control structure 402 includes a host interface 412 to communicate with a host 450. The host 450 can be any number of devices, e.g., CPU, computer, tablet, cell phone, GPU, or the like. The host interface 412 receives read and write commands from the host 450 and sends suitable control information to other components in the RRAM device 400 in order to execute the commands received. The host interface 412 subsequently sends the information or results obtained from memory structure 404 to the host 450. An address counter register 414 receives a start address from the host interface 414. The start address is the address of the starting location for performing an operation, e.g., search for a given Logical Block Address (LBA) to perform a read or write operation or search for given data hash for a data de-duplication operation, or the like. An address decoder 416 receives the address information from the address counter register 414 and decodes the address information. A row driver 418 receives the decoded address information and selects a row of memory cells. A row of memory cells is referred to herein as a page.

A sequence controller 420 receives a start command from the host interface 412 when an operation is to be performed. In an implementation, the sequence controller 420 receives the start command at substantially the same time the address counter register 414 receives the start address from the host interface 412. The start command (or enable signal) alerts the sequence controller 420 that an operation (e.g., read or write operation) is to start. In some embodiments, to execute the operation, a lookup process is performed, e.g., to identify the page to which operation is to be performed. The sequence controller 420 increments the address in the address counter register 414 to the next address for search until the correct page is identified.

A search pattern register 422 receives a data pattern being searched from the host interface 412. The data pattern received may vary depending on the operation being performed. For read or write operations, the search pattern register 422 receives a logical page number on which the read/write operation is to be performed. However, the search pattern can be status information of a page, the page number to be recycled, etc.

A compare circuit 424 receives the data pattern to be searched from the search pattern register 422 as a plurality of first inputs A. A sense amplifier unit 426 receives data read from the page selected by the row driver 418 and provides these as a plurality of second inputs B to the compare circuit 424. The compare circuit 424 compares the first inputs A and the second inputs B. The result of the comparison is sent to the sequence controller 420. If a match has been found, the sequence controller 420 notifies the host interface 412 that the match has been found. If not found, the sequence controller 420 increments the address information in the address counter register 414 to the next address so that the data can be read out from the next address.

In an embodiment, the address counter register 414, the sequence controller 420, the search pattern register 422, and the compare circuit 424 are all implemented as hardware in the control structure 402 in order to speed up the operation. All these hardware components are typically provided directly below the memory structure 404, although in other embodiments, the hardware components may be provided between memory structures 404, i.e., sandwich.

Figure 5:
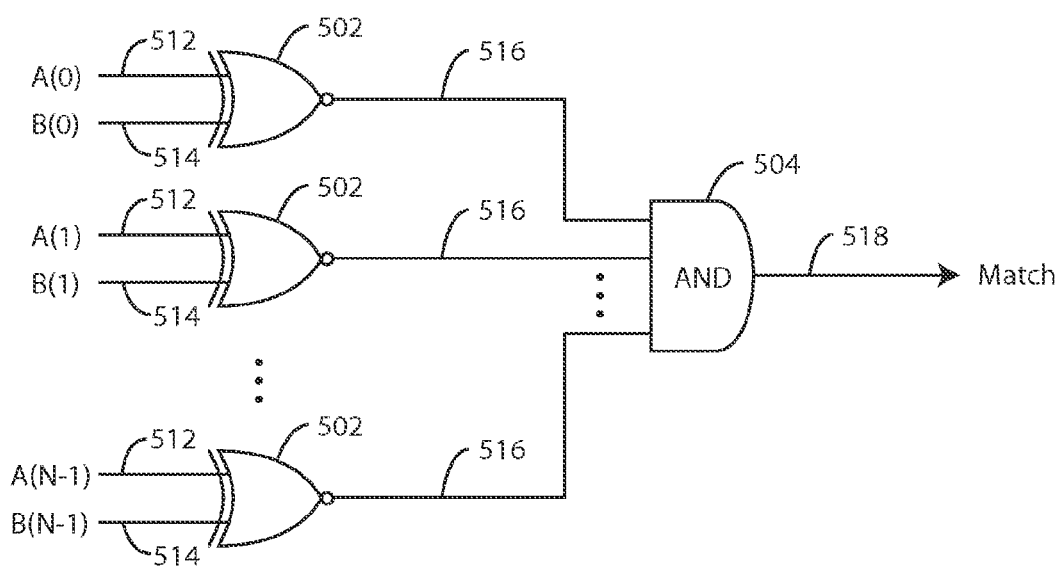
FIG. 5 illustrates a compare circuit according to an embodiment.

FIG. 5 illustrates a compare circuit 500 according to an embodiment. The compare circuit 500 includes a plurality of XNOR gates 502 and an AND gate 504. Each XNOR gate 502 receives a first input 512 from a search pattern register 422 and a second input 514 from a sense amplifier unit 426. If the first and second inputs are the same, the XNOR gate 502 outputs "1". Otherwise, the XNOR gate 502 outputs "0". These outputs are provided to the AND gate 504. If all the inputs are "1", then a match has been found, and the AND gate 504 outputs "1" via its output node 518 to a sequence controller 420. The sequence controller then notifies a host interface 412 that the match has been found. If the AND gate 504 outputs "0", the sequence controller increments the address information in an address counter register 414 and the next page is read out for comparison.

Alternatively, the comparator may be implemented using XOR gates for 502 and a NOR gate for 504. XOR gates output a "0" when the inputs match and a "1" on mismatch. NOR gates output a "1" when all the inputs are "0," e.g., when all the inputs A(i) and B(i) match.

Figure 6:
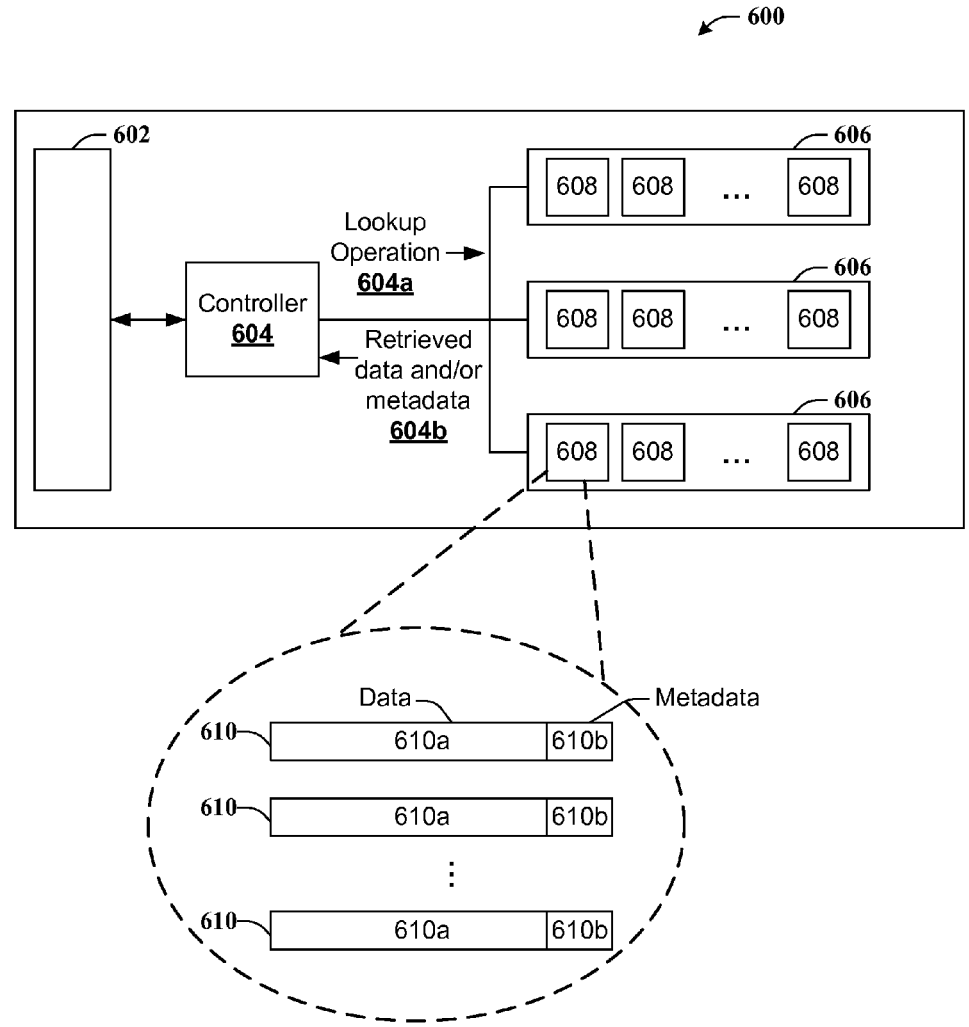
FIG. 6 illustrates a solid-state drive (SSD) including a plurality of solid state devices (e.g., RRAM devices) according to an embodiment.

FIG. 6 illustrates a solid-state drive (SSD) 600 including a plurality of solid state devices (e.g., RRAM devices) according to an embodiment. The SSD includes an I/O interface 602 that interface with an external device (not shown), e.g., a computer, a computing device. The I/O interface 602 may replicate an HDD environment. The interface may be Serial ATA, Serial attached SCSI, PCI Express, Fibre Channel, USB, Parallel ATA, MMC, eMMC, SDCARD, UFS or the like. A SSD controller 604 controls the operations of the SSD 600 and includes a CPU and other components. One or more memory modules 606 stores data for the SSD 600.

In an embodiment, the memory modules 606 includes one or more RRAM devices 608. The RRAM device 608 corresponds to the RRAM device 400 and the SSD controller 604 corresponds to the host 450 of FIG. 4. A row of memory cells in the RRAM device 608 defines a page that has a data area and a spare area. Data are stored in the data area and metadata are stored in the spare area. The metadata include logical page address for the page, wear leveling data, and the like. Logical block address (LBA) and other lookup operations are performed at the RRAM device 608 using hardware components such as the compare circuit 424, the sequence controller 420, and others. Accordingly, unlike a conventional SSD device, the SSD 600 does not need a DRAM to store a directory of block placement and/or wear leveling data, which would raise the component cost, and increase power consumption and size of the SSD.

Figure 7:
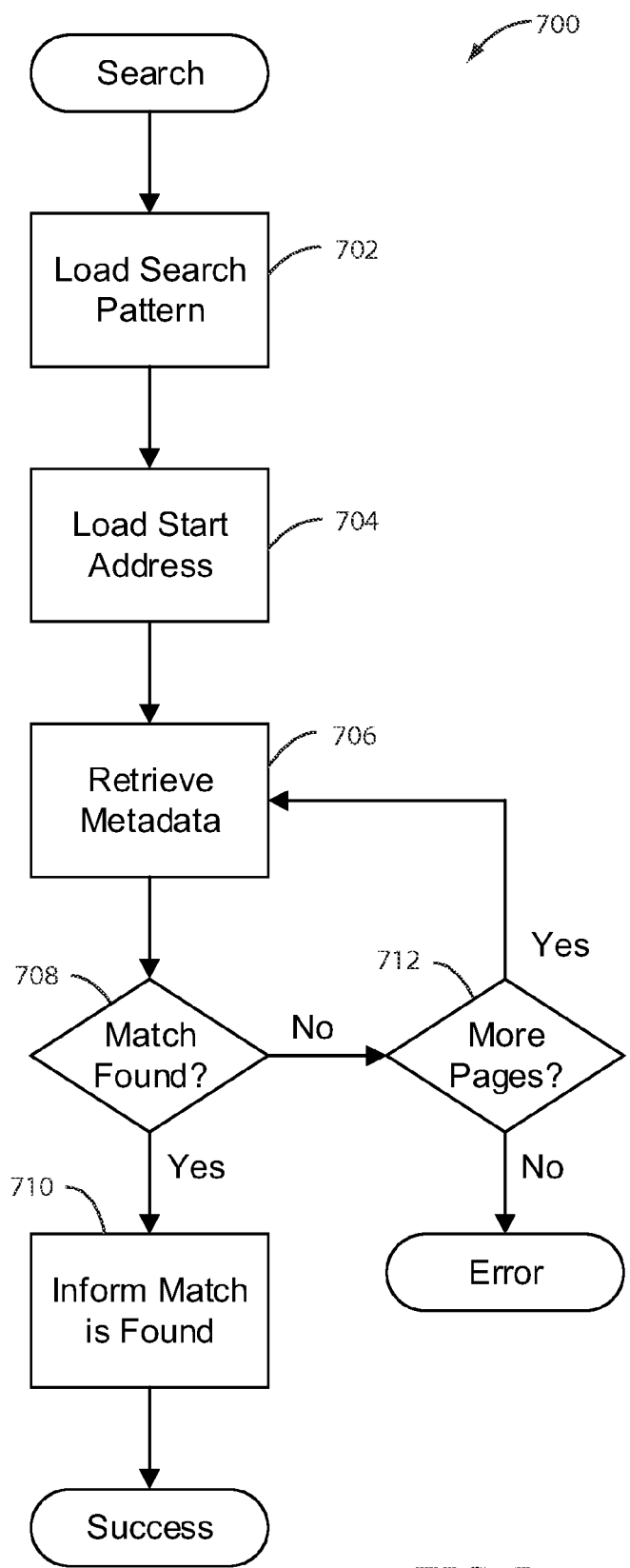
FIG. 7 illustrates a lookup process according to an embodiment.

FIG. 7 illustrates a lookup process 700 according to an embodiment. The process 700 is described in terms of a logical block address (LBA) lookup process and the components of FIG. 4 are used below for illustrative convenience. At 702, a search pattern is loaded in the search pattern register 422. The search pattern loaded is a logical address wherein a read or write operation is to be performed. At 704, a physical address of the first page to be examined is loaded to the address counter register. At 706, a page corresponding to the physical address loaded in the address counter register 414 is selected. The logical page address of the selected page is retrieved from an associated spare area of the selected page. At 708, a comparison of the retrieved logical page address and the search pattern is made to determine if these are a match. The comparison is performed by a compare circuit 424 in an implementation. If a match is found, at 710, the sequence controller 420 informs the host interface a match has been found. If the operation is a read operation, the data are read from the selected page. If the operation is a write operation, data are written into the selected page. The write operation may vary according to the wear leveling algorithms implemented.

On the other hand, if a match is not found, at 712, a next page is selected if there is an additional page to be examined. The process 700 returns to 706 and the physical page address of the next page is retrieved and compared. If there is no additional page to be examined, the process 700 ends.

Figure 8:
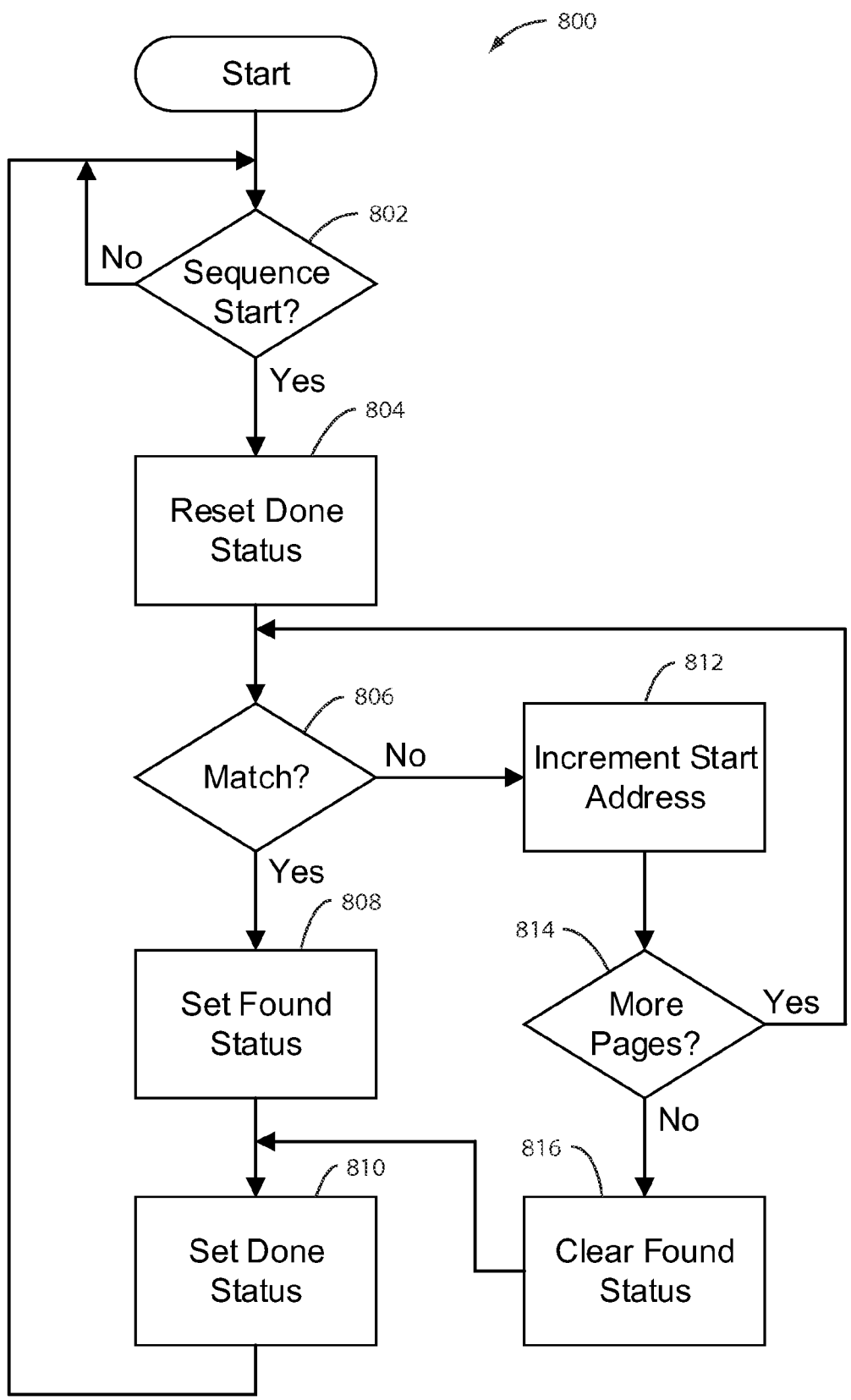
FIG. 8 illustrates a process performed by the sequence controller when the lookup process of FIG. 7 is performed according to an embodiment.

FIG. 8 illustrates a process 800 performed by the sequence controller 420 when the lookup process 700 is performed according to an embodiment. At 802, it is checked to see if the lookup process 700 has begun. If yes, the "done" status is reset in order to start the process (804). The sequence controller 420 waits to receive the result of a comparison performed by the compare circuit 424 (806). If the result received is a "match found," then the "found" status is set to indicate that a match has been found (808). The "found" status and the "done" status are set (808 and 810).

On the other hand, if result received from the compare circuit 424 is a "match not found," the address in the address counter register 414 is incremented to the next address (812). If there is any additional page left to be checked (814), the process 800 returns to 806 and wait to receive the comparison results from the compare circuit 424. If there are no more pages to be searched, the "found" status is cleared to indicate no match has been found (816). The "done" status is set (810). The sequence controller 420 waits for the next operation to be performed.

Figure 9:
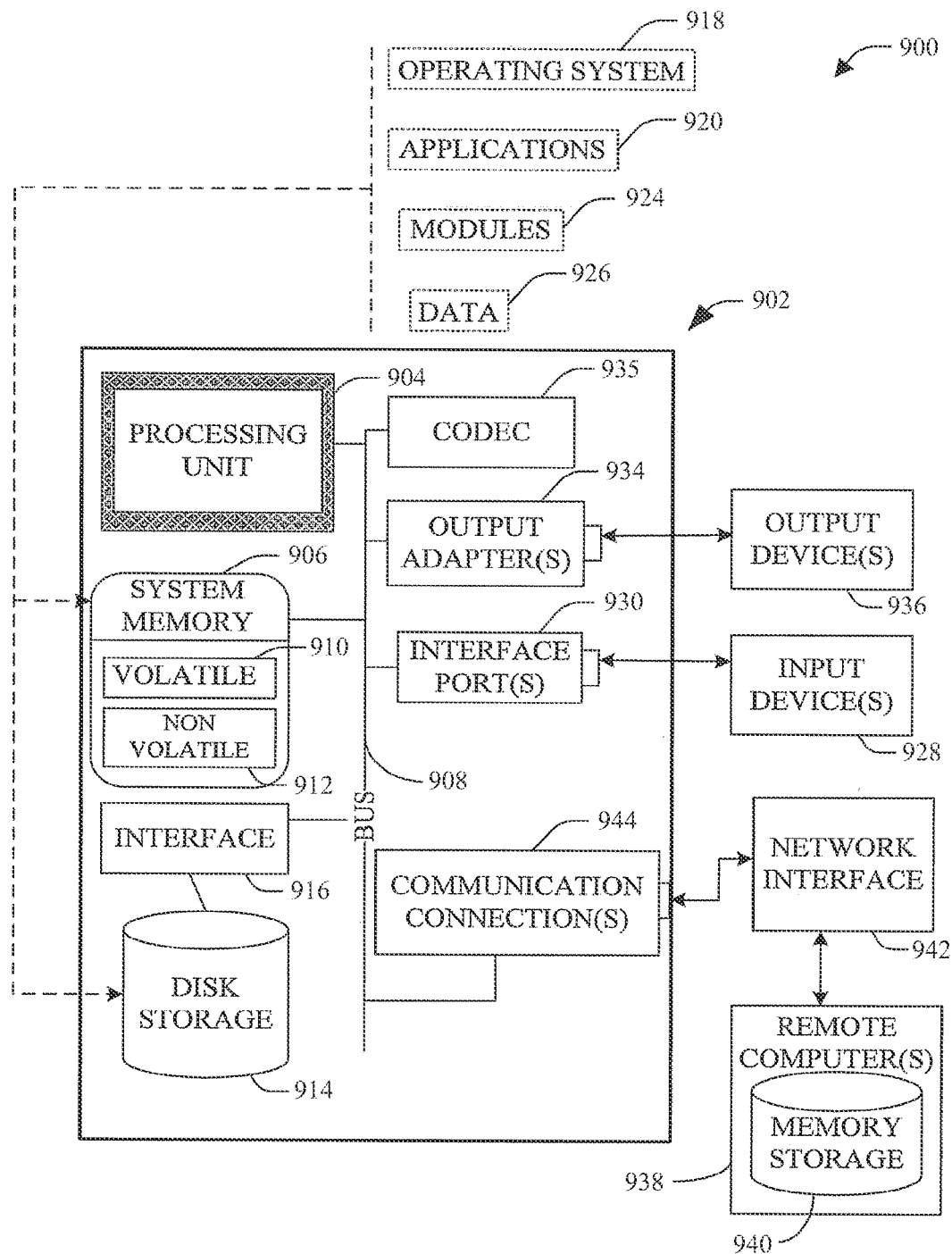
FIG. 9 illustrates a block diagram of an exemplary operating environment for facilitating implementation of one or more aspects disclosed herein.

FIG. 9 illustrates a block diagram of an exemplary operating environment for facilitating implementation of one or more aspects disclosed herein. Environment may include a computing system such as a mobile internet device (e.g. phone (iPhone, Android phone), tablet (iPad, Android tablet)), a computing device (e.g. laptop computer, kiosk, smart device (e.g. smart meter, smart sensors)), a storage device (e.g. disk, network storage), an imaging device (e.g. phone, still or video camera), an audio device (e.g. iPod), a vehicle, or the like. The systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

With reference to FIG. 9, a suitable environment 900 for implementing various aspects of the claimed subject matter includes a computer 902. The computer 902 includes a processing unit 904, a system memory 906, a codec 935, and a system bus 908. The system bus 908 couples system components including, but not limited to, the system memory 906 to the processing unit 904. The processing unit 904 can be any of various available processors. Dual microprocessors and other multiprocessor architectures also can be employed as the processing unit 904.

The system bus 908 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 906 includes volatile memory 910 and non-volatile memory 912. The basic input/output system (BIOS), containing the basic routines to transfer information between elements within the computer 902, such as during start-up, is stored in non-volatile memory 912. In addition, according to present innovations, codec 935 may include at least one of an encoder or decoder, wherein the at least one of an encoder or decoder may consist of hardware, software, or a combination of hardware and software. Although, codec 935 is depicted as a separate component, codec 935 may be contained within non-volatile memory 912. By way of illustration, and not limitation, non-volatile memory 912 can include read only memory (ROM), programmable ROM (PROM), electrically programmable ROM (EPROM), electrically erasable programmable ROM (EEPROM), or flash memory. Volatile memory 910 includes random access memory (RAM), which acts as external cache memory. According to present aspects, the volatile memory may store the write operation retry logic (not shown in FIG. 9) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM).

Computer 902 may also include removable/non-removable, volatile/non-volatile computer storage medium. FIG. 9 illustrates, for example, a storage device 914 (e.g., hard disk drive or solid state drive). In an embodiment, storage 914 is implemented using a solid state drive (SSD) such as that illustrated in FIG. 6. To facilitate connection of the storage devices 914 to the system bus 908, a removable or non-removable interface is typically used, such as interface 916.

It is to be appreciated that FIG. 9 describes software that acts as an intermediary between users and the basic computer resources described in the suitable operating environment 900. Such software includes an operating system 918. Operating system 918, which can be stored on disk storage 914, acts to control and allocate resources of the computer system 902. Applications 920 take advantage of the management of resources by operating system 918 through program modules 924, and program data 926, such as the boot/shutdown transaction table and the like, stored either in system memory 906 or on disk storage 914. It is to be appreciated that the claimed subject matter can be implemented with various operating systems or combinations of operating systems.

A user enters commands or information into the computer 902 through input device(s) 928. Input devices 928 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 904 through the system bus 908 via interface port(s) 930. Interface port(s) 930 include, for example, a serial port, a parallel port, a game port, and a universal serial bus (USB). Output device(s) 936 use some of the same type of ports as input device(s) 928. Thus, for example, a USB port may be used to provide input to computer 902 and to output information from computer 902 to an output device 936. Output adapter 934 is provided to illustrate that there are some output devices 936 like monitors, speakers, and printers, among other output devices 936, which require special adapters. The output adapters 934 include, by way of illustration and not limitation, video and sound cards that provide a means of connection between the output device 936 and the system bus 908. It should be noted that other devices and/or systems of devices provide both input and output capabilities such as remote computer(s) 938.

Computer 902 can operate in a networked environment using logical connections to one or more remote computers, such as remote computer(s) 938. The remote computer(s) 938 can be a personal computer, a server, a router, a network PC, a workstation, a microprocessor based appliance, a peer device, a smart phone, a tablet, or other network node, and typically includes many of the elements described relative to computer 902. For purposes of brevity, only a memory storage device 940 is illustrated with remote computer(s) 938. Remote computer(s) 938 is logically connected to computer 902 through a network interface 942 and then connected via communication connection(s) 944. Network interface 942 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 944 refers to the hardware/ software employed to connect the network interface 942 to the bus 908. While communication connection 944 is shown for illustrative clarity inside computer 902, it can also be external to computer 902. The hardware/software necessary for connection to the network interface 942 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

A number of embodiments have been described. Nevertheless, it will be understood that various modifications may be made without departing from the spirit and scope of the invention. For example, the ordering of layers on the substrate could be reversed, where the top electrode is provided below the bottom electrode depending on implementation.

Accordingly the terms "top" and "bottom" should not be used to limit the relative positions of the source electrode that provides the filament-forming metal particles in the switching layer and an electrode provided at its opposing side. Accordingly, other embodiments are within the scope of the following claims.

What is claimed is:

1. A memory system including a memory device, the memory device comprising:
  a substrate;
  an interface configured to receive input data at the memory device or provide output data from the memory device;
  a memory array communicatively coupled to the interface and defining a plurality of pages, a subset of the plurality of pages each including respective data areas for storing data and respective spare areas for storing metadata; and a compare circuit communicatively coupled to the memory array and configured to receive metadata retrieved from the subset of the plurality of pages and compare the retrieved metadata to a search pattern, wherein the memory array and the compare circuit are formed in different layers of the memory device, and wherein the output data includes control information or search result information provided from the memory device via the interface.

2. The memory system of claim 1, wherein the memory device further comprises:
a control layer; and
a memory layer provided on top of the control layer,
wherein the compare circuit is formed in the control layer and the memory array is formed in the memory layer.

3. The memory system of claim 2, wherein the memory array includes a resistive memory cell and defines a crossbar array.

4. The memory system of claim 2, wherein the memory device further comprises:
a search pattern register configured to receive a search pattern; and
a sense amplifier unit configured to retrieve the metadata from the subset of the plurality of pages in the memory array,
wherein the compare circuit determines a match is found in response to comparing the search pattern received from the search pattern register and the metadata received from the sense amplifier unit.

5. The memory system of claim 4, wherein the memory device further comprises:
a sequence controller configured to receive a result of the comparison performed by the compare circuit.

6. The memory system of claim 5, wherein the metadata received by the compare circuit is a logical page address of a selected page and the search pattern received by the compare circuit is a logical page address of a page whereon a read or write operation is to be performed.

7. The memory system of claim 5, wherein the memory device further comprises:
an address counter register configured to receive a start address from the interface,
wherein the sequence controller is configured to provide the address counter register with another address to search in response to the result of the comparison indicating the match is not found.

8. The memory system of claim 7, wherein the search pattern register, the sense amplifier unit and the address counter register are formed below the memory array.

9. The memory system of claim 8, wherein the search pattern register, the sense amplifier unit and the address counter register are formed in the control layer.

10. The memory system of claim 8, wherein the memory system is a memory module including a plurality of packaged RRAM chips, and the memory device is one of the plurality of packaged RRAM chips.

11. The memory system of claim 8, wherein the memory system is a solid state drive (SSD) and the memory device is a memory module provided in the SSD.

12. The memory system of claim 1, wherein the compare circuit includes a plurality of XNOR gates comprising respective outputs and an AND gate, wherein the outputs of the XNOR gates are provided to inputs of the AND gate.

13. A memory device comprising:
a substrate;
a memory array defining a plurality of pages, each page including a data area for storing data and a spare area for storing metadata;
a plurality of two-terminal memory cells defining the memory array; and
a compare circuit communicatively coupled with the memory array and configured to sequentially receive metadata retrieved from two or more of the plurality of pages and iteratively compare the metadata to a search pattern in response to each receipt of the metadata or the search pattern,
wherein the memory array and the compare circuit are formed in different layers of the memory device, and wherein control information or result information is output from the memory device in response to a memory operation pertaining to the search pattern.

14. The memory device of claim 13, wherein the two-terminal memory cells are resistive memory cells that are defined in a crossbar array.

15. The memory device of 13, further comprising:
a control layer; and
a memory layer provided on top of the control layer,
wherein the compare circuit is formed in the control layer and the memory array is formed in the memory layer.

16. The memory device of claim 13, further comprising:
a search pattern register configured to receive a search pattern; and
a sense amplifier unit configured to retrieve the metadata from the two or more of the plurality of pages in the memory array,
wherein the compare circuit determines if a match is found by comparing the search pattern received from the search pattern register and the metadata received from the sense amplifier unit.

17. The memory device of claim 16, wherein the memory device further comprises:
a sequence controller configured to receive a result of the comparison performed by the compare circuit.

18. The memory device of claim 17, wherein the metadata received by the compare circuit is a logical page address of a selected page and the search pattern received by the compare circuit is a logical page address of a page whereon a read or write operation is to be performed.

19. The memory device of claim 17, further comprising:
a host interface for receiving the search pattern or for outputting the control information or result information; and
an address counter register configured to receive a start address from the host interface, wherein the sequence controller is configured to provide the address counter register with another address to search if the result received from the compare circuit indicates a match is not found.

20. The memory device of claim 13, wherein the compare circuit includes a plurality of XNOR gates comprising respective outputs and an AND gate, wherein the outputs of the XNOR gates are provided to inputs of the AND gate.

* * * * *